(12) United States Patent
Qian et al.

(10) Patent No.: US 10,128,817 B2
(45) Date of Patent: Nov. 13, 2018

(54) DIGITAL PHASE SHIFTER

(71) Applicant: Huawei Technologies Co., Ltd., Shenzhen (CN)

(72) Inventors: Huizhen Qian, Chengdu (CN); Xun Luo, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/816,163

(22) Filed: Nov. 17, 2017

(65) Prior Publication Data

US 2018/0145660 A1 May 24, 2018

(30) Foreign Application Priority Data

Nov. 18, 2016 (CN) .......................... 2016 1 1019105

(51) Int. Cl.
| | | |
|---|---|---|
| H03H 11/16 | (2006.01) | |
| H03H 17/08 | (2006.01) | |
| H03H 11/22 | (2006.01) | |
| H03H 11/20 | (2006.01) | |

(52) U.S. Cl.
CPC ............. *H03H 11/22* (2013.01); *H03H 11/16* (2013.01); *H03H 11/20* (2013.01); *H03H 17/08* (2013.01)

(58) Field of Classification Search
CPC ............................... H03H 11/16; H03H 17/08
See application file for complete search history.

(56) References Cited

U.S. PATENT DOCUMENTS

| | | | | |
|---|---|---|---|---|
| 8,736,336 B2* | 5/2014 | Kishimoto | ................ | H01P 1/18 327/254 |
| 8,947,147 B1* | 2/2015 | Zhang | ..................... | H04L 27/18 327/238 |
| 9,602,054 B2* | 3/2017 | Chakraborty | ........ | H03D 7/1441 |
| 2008/0224910 A1 | 9/2008 | Chen | | |

(Continued)

FOREIGN PATENT DOCUMENTS

| | | |
|---|---|---|
| CN | 103297004 A | 9/2013 |
| CN | 104917489 A | 9/2015 |
| EP | 1351390 A1 | 10/2003 |

OTHER PUBLICATIONS

Ellinger, F., et al., "Integrated Adjustable Phase Shifters" IEEE Microwave Magazine, IEEE Service Center, vol. 11, No. 6, Oct. 2010, XP011317705, 12 pages.

(Continued)

*Primary Examiner* — Hai L Nguyen
(74) *Attorney, Agent, or Firm* — Conley Rose, P.C.

(57) ABSTRACT

A digital phase shifter includes a logic control circuit, at least four current digital-to-analog converters, at least four amplifiers, and a vector summation circuit. The logic control circuit generates four N-bit digital phase shift control signals according to an (N+2)-bit digital control source signal, and respectively inputs the four N-bit digital phase shift control signals to the four current digital-to-analog converters. The four current digital-to-analog converters are respectively connected in series with the four amplifiers, to implement selection and amplification on four orthogonal input signals, and the vector summation circuit synthesizes amplified signals that are output by the four amplifiers, to obtain a signal having a 360 degree (°) phase shift range.

10 Claims, 6 Drawing Sheets

(56) References Cited

U.S. PATENT DOCUMENTS

2009/0195286 A1   8/2009  Rylov
2010/0026367 A1   2/2010  Jiang
2013/0076419 A1   3/2013  Nedovic
2013/0207706 A1   8/2013  Yanagisawa

OTHER PUBLICATIONS

Foreign Communication From a Counterpart Application, European Application No. 17202002.6, Extended European Search Report dated Mar. 9, 2018, 11 pages.
Machine Translation and Abstract of Chinese Publication No. CN104917489, Sep. 16, 2015, 11 pages.
Foreign Communication From a Counterpart Application, Chinese Application No. 201611019105.7, Chinese Office Action dated Sep. 5, 2018, 9 pages.

* cited by examiner

DIGITAL PHASE SHIFTER

CROSS-REFERENCE TO RELATED APPLICATION

This non-provisional application claims priority to Chinese Patent Application No. 201611019105.7, filed on Nov. 18, 2016, which is hereby incorporated by reference in its entirety.

TECHNICAL FIELD

This application relates to the field of phase shifter technologies, and in particular, to a digital phase shifter.

BACKGROUND

In a wireless transceiver system, an ideal isotropic antenna transmits radio frequency signals uniformly in directions. However, a large amount of energy in the transmit signals is not received by a receive antenna, leading to a relatively small received signal power and a relatively large space transmission power loss. According to beamforming technologies, a directional antenna beam may be generated to resolve the problem. An active phased array transceiver system is one of the beamforming technologies. In an active phased array transceiver system shown in FIG. 1, antennas are arranged linearly at an equal distance (d) to form an array, phase differences between input radio frequency signals of adjacent antennas are all α (that is, a latency ΔT), and a beam angle θ is determined by the following formula:

$$\theta = \sin^{-1}\left(\frac{\alpha}{2\pi}\frac{\lambda}{d}\right),$$

where λ is a wavelength of a carrier $f_0$ of a transmit signal.

Each transmitter controls the radio frequency signal phase difference α by using an independently controlled phase shifter. A minimum phase shift degree of the phase shifter is a phase shift precision, and a minimum phase shift degree of the beam angle θ is a scan precision. It can be learned from the beam angle calculation formula that, when the phased array system has a specific phase shift precision, a larger d between adjacent antennas indicates a higher scan precision θ, and the higher scan precision indicates a larger transmission radius of a transmit signal. Therefore, the scan precision of the phase shifter can be increased by increasing the phase shift precision of the phase shifter, to effectively increase the transmission radius of the signal transmitted by the system, and reduce the antenna distance. It can be learned that, a high-precision phase shifter is a key device for implementing a miniaturized phased array transceiver system having a high scan precision.

However, the prior art has the following disadvantages. Existing frequently-used phase shifters mainly include a passive phase shifter that is based on a passive scaling network, an active phase shifter, and the like. The passive phase shifter has a relatively large circuit area because an element such as an on-chip integrated inductor is used, and is inapplicable to a miniature wireless communications device. Moreover, a phase shift precision needs to be increased, and this further increases complexity of the passive scaling network, thereby making it difficult to satisfy requirements for miniaturization and a high precision. A circuit of an existing active phase shifter is complex, which is unfavorable to increase a phase shift precision, and a noise signal is easily introduced during quadrant switching performed by using an radio frequency (RF) path serially-connected switch that is commonly used in the active phase shifter, and deteriorates a phase error and an amplitude error and increases an insertion loss. Although the active phase shifter has a calibration circuit, the phase shift precision is not significantly increased after calibration (for an active phase shifter with a 4-bit precision, the phase shift precision can be increased by only 1 bit after calibration). Therefore, it is necessary to provide a new phase shifter, to satisfy phase shift control requirements for a high phase shift precision, miniaturization, and a small phase error/amplitude error.

SUMMARY

This application provides a digital phase shifter, to satisfy phase shift control requirements for a high phase shift precision, miniaturization, and a small phase error/amplitude error.

A digital phase shifter provided in an embodiment of this application includes a logic control circuit, at least four current digital-to-analog converters, at least four amplifiers, and a vector summation circuit, where the logic control circuit is configured to receive an (N+2)-bit digital control source signal, generate four N-bit digital phase shift control signals according to the (N+2)-bit digital control source signal, and output the four N-bit digital phase shift control signals, where low-order N bits of the (N+2)-bit digital control source signal are used to control magnitudes of the four N-bit digital phase shift control signals, high-order 2 bits of the (N+2)-bit digital control source signal are used to control a correspondence between the four N-bit digital phase shift control signals and four output ends of the logic control circuit, and N is a natural number; input ends of the four current digital-to-analog converters are respectively coupled to the four output ends of the logic control circuit, and the four current digital-to-analog converters are each configured to receive one of the four N-bit digital phase shift control signals, convert the four N-bit digital phase shift control signals into four current signals by means of digital-to-analog conversion, and output the four current signals; gain control ends of the four amplifiers are respectively coupled to output ends of the four current digital-to-analog converters, and the four amplifiers are configured to respectively receive four orthogonal input signals, perform gain control on the four orthogonal input signals by using the four current signals to obtain four amplified signals, and output the four amplified signals, where each amplifier corresponds to one input signal and one current signal; and an input end of the vector summation circuit is separately coupled to output ends of the four amplifiers, an output end of the vector summation circuit is used as an output end of the digital phase shifter, and the vector summation circuit is configured to perform vector summation on the amplified signal that is output by any of the four amplifiers to obtain a phase-shifted signal, and output the phase-shifted signal.

The digital phase shifter provided in this embodiment of this application has the following beneficial effects.

(1) Phase shift within four ranges are 0 degree (°) to 90°, 90° to 180°, 180° to 270°, and 270° to 360° and can be implemented by using the logic control circuit, no additional phase shift switching circuit needs to be disposed, noise can be reduced, and a phase error/amplitude error can be reduced.

(2) A circuit structure is simple, an area occupied for manufacturing an integrated circuit is small, and chip costs can be reduced.

(3) The digital phase shifter is provided with the amplifiers, so that a signal that is output by the digital phase shifter has a larger gain as compared with an input signal, system efficiency can be improved, and it is helpful to drive a next power amplifier connected in series with the phase shifter.

(4) A phase shift precision is high, and a precision value of the digital phase shifter can be adjusted by changing a total bit quantity of the digital control source signal and a precision of the current digital-to-analog converter, so that different phase shifter design requirements are satisfied. In addition, because a high-precision phase shifter can reduce an antenna distance in a phased array system, the digital phase shifter provided in this embodiment can satisfy an application requirement for a miniaturized mobile device.

In addition, in an actual application process, the digital control source signal of the digital phase shifter in this embodiment of this application can be modified by using a digital pre-distortion (DPD) method, to accurately and precisely control a signal that is output by the digital phase shifter, and reduce a phase error/amplitude error of the phase shifter. The DPD method may be implemented by using software or reconfigurable hardware such as a field-programmable gate array (FPGA) or an on-chip digital circuit into which the digital phase shifter is to be integrated.

In a possible implementation, the logic control circuit controls, according to four different values of the high-order 2 bits in the (N+2)-bit digital control source signal, the four output ends to operate in four different output states; and in any output state, an N-bit digital phase shift control signal that is output by one of the four output ends is C1, an N-bit digital phase shift control signal that is output by another output end is C2, and N-bit digital phase shift control signals that are output by the other two output ends are 0; and in different output states, different output ends output the N-bit digital phase shift control signal that is C1, where C1 is the same as the low-order N bits of the (N+2)-bit digital control source signal; and C2 and C1 satisfy the following relationship $C2=\sqrt{(2^N-1)^2-C1^2}$.

In a possible implementation, the phase-shifted signal has four phase shift ranges, and the four phase shift ranges are in one-to-one correspondence with the four output states of the logic control circuit; and the four phase shift ranges are 0° to 90°, 90° to 180°, 180° to 270°, and 270° to 360°.

According to the digital phase shifter provided in this embodiment of this application, a phase shift range is changed by changing a high-order 2-bit signal of the (N+2)-bit digital control source signal that is input to the logic control circuit, to change values C1 and C2 of the two non-0 digital phase shift control signals by changing a low-order N-bit signal of the digital control source signal, and change a phase of a phase-shifted signal out that is finally obtained by means of vector synthesis, thereby implementing phase shift of a to-be-phase-shifted signal within a phase shift range of the high-order 2-bit signal. It can be learned that, according to this application, phase shift control within a 360° phase shift range is implemented by using a digital signal, no additional phase shift switching circuit needs to be disposed, and the precision value of the digital phase shifter is adjusted by changing the total bit quantity of the digital control source signal and the precision of the current digital-to-analog converter, so that a good control precision is ensured, and different phase shifter design requirements are satisfied.

In a possible implementation, the current digital-to-analog converter includes N transistors connected in parallel; sources of the N transistors are grounded; drains of the N transistors are connected, and used as an output end of the current digital-to-analog converter; and gates of the N transistors are used as input ends of the current digital-to-analog converter, and each input end receives one bit of digital signal in the N-bit digital phase shift control signal, to control connection and disconnection between a drain and a source of a corresponding transistor.

In a possible implementation, a magnitude of a current that is output by a drain of any transistor in the current digital-to-analog converter when the transistor is turned on is in direct proportion to a weight of a bit of a digital phase shift control signal that is input to a gate of the transistor.

In a possible implementation, the current that is output by the drain of the any transistor in the current digital-to-analog converter when the transistor is turned on is $I_i=2^i I_0$, where i is the bit of the digital phase shift control signal that is input to the gate of the any transistor, i=0, 1, 2, ..., or N−1, and $I_0$ is a preset current value.

In a possible implementation, the amplifier includes a differential transistor pair; sources of the differential transistor pair are connected, and used as a gain control end of the amplifier; gates of the differential transistor pair are used as input ends of the amplifier, and receive two phase-inverted input signals in the four orthogonal input signals; and drains of the differential transistor pair are used as output ends of the amplifier, and output a pair of differential signals that are obtained after the two phase-inverted input signals are amplified.

According to the phase shifter provided in this embodiment of this application, magnitudes of currents that are output by the current digital-to-analog converters can be changed by changing the low-order N-bit signal of the digital control source signal, to change operating states and amplification times of the amplifiers, and change a phase shift range and an amplitude value of the phase-shifted signal out that is output by the phase shifter.

In a possible implementation, the digital phase shifter further includes a digital calibration circuit, where an output end of the digital calibration circuit is connected to an input end of the logic control circuit; and the digital calibration circuit is configured to generate the (N+2)-bit digital control source signal according to a DPD algorithm.

In a possible implementation, the digital calibration circuit is reconfigurable, and includes any of the following reconfigurable hardware such as a processing chip storing calibration software, a FPGA, or an on-chip digital circuit into which the digital phase shifter is to be integrated.

In a possible implementation, the digital calibration circuit is specifically configured to determine, according to a preset control code table, a control code corresponding to a phase of a to-be-output phase-shifted signal, and use the determined control code as the (N+2)-bit digital control source signal.

Compared with an existing phase shifter based on an active calibration circuit, the digital phase shifter provided in this embodiment of this application implements digital calibration by using a DPD method that is based on software or reconfigurable hardware, so that circuit complexity can be reduced, an effective phase precision of the phase shifter can be increased, and the phase error and the amplitude error of the phase shifter can be reduced.

BRIEF DESCRIPTION OF THE DRAWINGS

To describe the technical solutions in the embodiments of this application more clearly, the following describes the accompanying drawings required for describing the embodiments. A person of ordinary skill in the art may still derive other drawings from these accompanying drawings without creative efforts.

DESCRIPTION OF EMBODIMENTS

Figure 1:
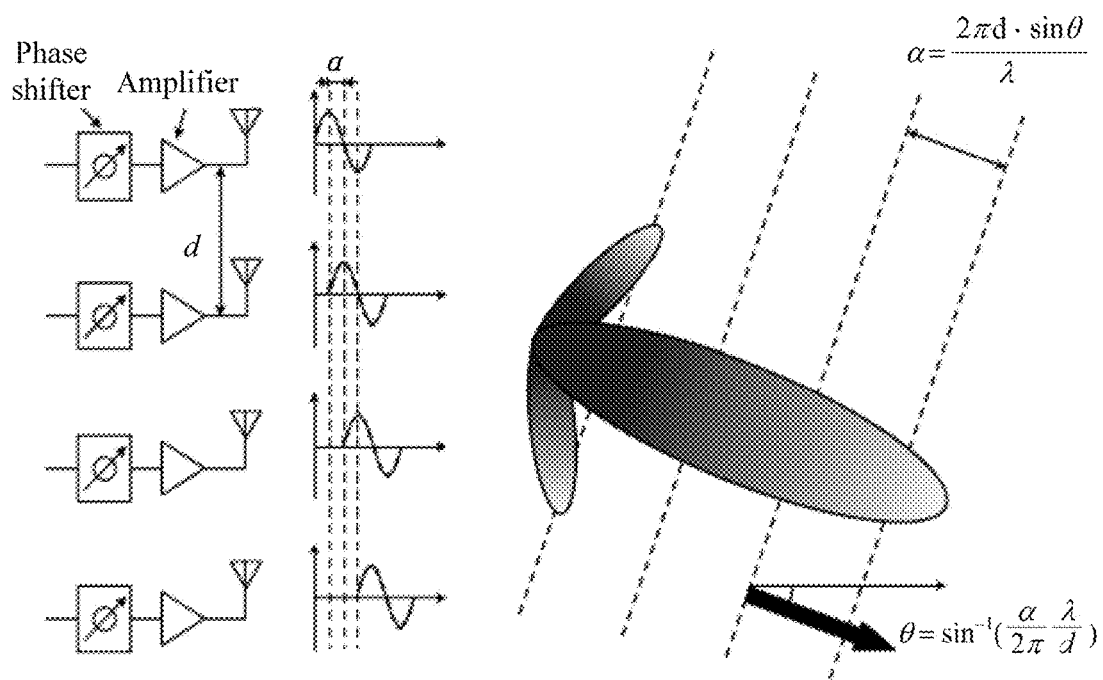
FIG. 1 is a diagram of a phase scan principle of an existing active phased array transceiver system.

The following clearly describes the technical solutions in the embodiments of the disclosure with reference to the accompanying drawings in the embodiments of the disclosure. Apparently, the described embodiments are merely a part rather than all of the embodiments of the disclosure. All other embodiments obtained by a person of ordinary skill in the art based on the embodiments of the disclosure without creative efforts shall fall within the protection scope of the disclosure.

A digital phase shifter provided in an embodiment of this application includes a logic control circuit, at least four current digital-to-analog converters, at least four amplifiers, and a vector summation circuit.

The logic control circuit is configured to receive an (N+2)-bit digital control source signal, generate four N-bit digital phase shift control signals according to the (N+2)-bit digital control source signal, and output the four N-bit digital phase shift control signals, where low-order N bits of the (N+2)-bit digital control source signal are used to control magnitudes of the four N-bit digital phase shift control signals, high-order 2 bits of the (N+2)-bit digital control source signal are used to control a correspondence between the four N-bit digital phase shift control signals and four output ends of the logic control circuit, and N is a natural number.

Input ends of the four current digital-to-analog converters are respectively coupled to the four output ends of the logic control circuit, and the four current digital-to-analog converters are each configured to receive one of the four N-bit digital phase shift control signals, convert the four N-bit digital phase shift control signals into four current signals by means of digital-to-analog conversion, and output the four current signals.

Gain control ends of the four amplifiers are respectively coupled to output ends of the four current digital-to-analog converters, and the four amplifiers are configured to respectively receive four orthogonal input signals, perform gain control on the four orthogonal input signals by using the four current signals to obtain four amplified signals, and output the four amplified signals, where each amplifier corresponds to one input signal and one current signal.

An input end of the vector summation circuit is separately coupled to output ends of the four amplifiers, an output end of the vector summation circuit is used as an output end of the digital phase shifter, and the vector summation circuit is configured to perform vector summation on the amplified signal that is output by any of the four amplifiers to obtain a phase-shifted signal, and output the phase-shifted signal.

The digital phase shifter provided in this embodiment of this application can be applied to various systems having a transmitter and a receiver, such as a phased array transceiver system and a multiple-input multiple-output (MIMO) system.

It should be noted that, in the digital phase shifter in this embodiment of this application, there are at least four current digital-to-analog converters and at least four amplifiers, to form four current digital-to-analog conversion circuits and four amplification circuits. That is, each current digital-to-analog conversion circuit includes one or more current digital-to-analog converters, and each amplification circuit includes one or more amplifiers.

When at least one current digital-to-analog conversion circuit includes multiple current digital-to-analog converters, that is, a total quantity of the current digital-to-analog converters is greater than 4 (for example, 5, 6, 8, or 12), the multiple current digital-to-analog converters in the corresponding current digital-to-analog conversion circuit are connected in parallel to each other, to perform digital-to-analog conversion on a same N-bit digital phase shift control signal. Obtained multiple current signals are superimposed and output, so that a stronger current signal is obtained (as compared with a case in which the current digital-to-analog conversion circuit includes only one current digital-to-analog converter).

When at least one amplification circuit includes multiple amplifiers, that is, a total quantity of the amplifiers is greater than 4 (for example, 5, 6, 8, or 12), the multiple amplifiers in the corresponding amplification circuit are connected in series, and gain control ends receive a current signal that is output by a same current digital-to-analog conversion circuit, to successively amplify one input signal multiple times.

The embodiments of this application focus on description of a structure and an operating principle of a digital phase shifter when each current digital-to-analog conversion circuit includes only one current digital-to-analog converter, and each amplification circuit includes only one amplifier. A person skilled in the art can understand and obtain a structure and an operating principle of a digital phase shifter in another case with reference to the description.

Figure 2:
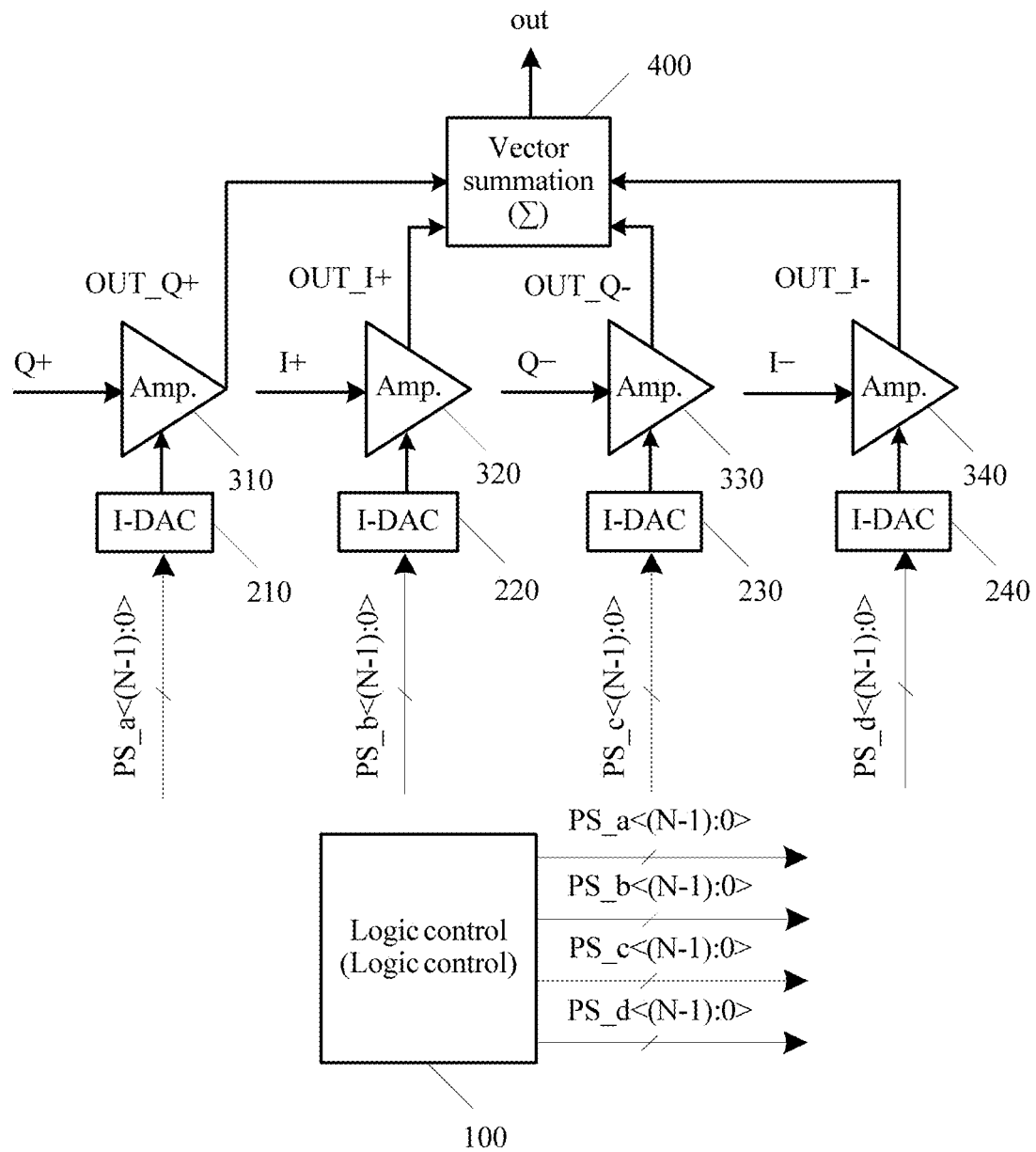
FIG. 2 is diagram of a circuit module of a digital phase shifter according to an embodiment of this application.
Figure 3A:
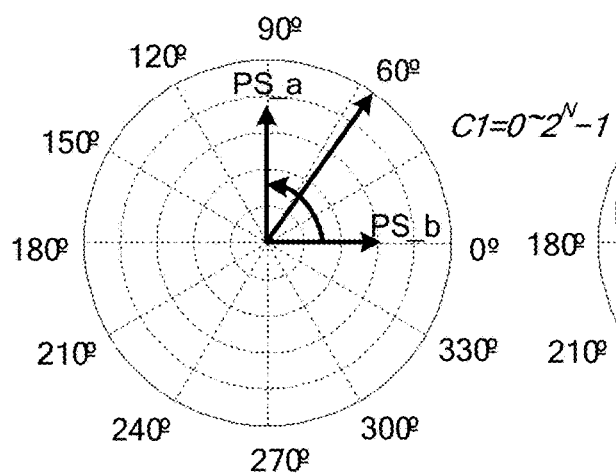
FIGS. 3A-3D are diagrams of phase shift control principles of a digital phase shifter according to an embodiment of this application.
Figure 3B:
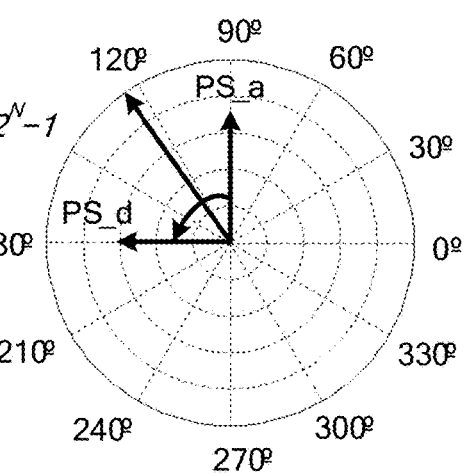
Figure 3C:
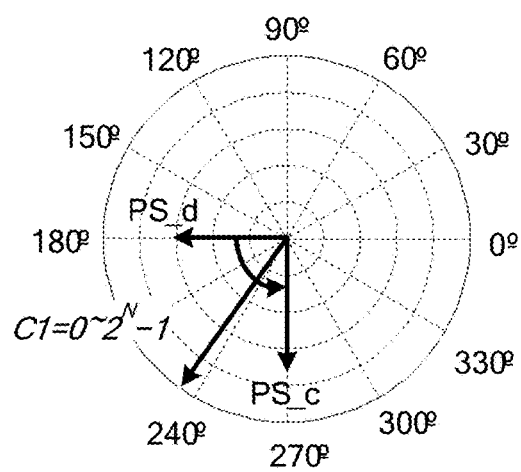
Figure 3D:
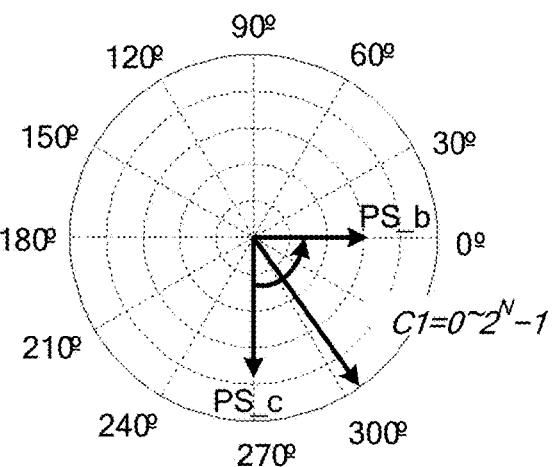

The following describes, with reference to the diagram of a circuit module in FIG. 2, a structure of a digital phase shifter provided in an embodiment of this application. As shown in FIG. 2, the digital phase shifter includes a logic control circuit 100, four current digital-to-analog converters (I-DAC) respectively numbered 210, 220, 230, and 240, four amplifiers respectively numbered 310, 320, 330, and 340, and a vector summation circuit 400.

An input end of the logic control circuit 100 receives an (N+2)-bit digital control source signal PS<(N+1):0>, and four output ends of the logic control circuit 100 respectively output N-bit digital phase shift control signals PS_a<(N−1):0>, PS_b<(N−1):0>, PS_c<(N−1):0>, and PS_d<(N−1):0>.

The four output ends of the logic control circuit 100 are each connected to an input end of one I-DAC, that is, PS_a<(N−1):0> output by a first output end of the logic control circuit 100 is input to an input end of the I-DAC 210, PS_b<(N−1):0> output by a second output end is input to an input end of the I-DAC 220, PS_c<(N−1):0> output by a third output end is input to an input end of the I-DAC 230, and PS_d<(N−1):0> output by a fourth output end is input to an input end of the I-DAC 240.

The logic control circuit 100 may be specifically implemented by using any logic control circuit or logic control chip.

An output end of each I-DAC is connected to a gain control end of one amplifier, that is, the I-DAC 210 converts the digital phase shift control signal PS_a<(N−1):0> into a corresponding analog current signal, and inputs the analog current signal to a gain control end of the amplifier 310, to control a gain (amplification times) of the amplifier 310; the I-DAC 220 converts the digital phase shift control signal PS_b<(N−1):0> into a corresponding analog current signal, and inputs the analog current signal to a gain control end of the amplifier 320, to control a gain of the amplifier 320; the I-DAC 230 converts the digital phase shift control signal PS_c<(N−1):0> into a corresponding analog current signal, and inputs the analog current signal to a gain control end of the amplifier 330, to control a gain of the amplifier 330; and the I-DAC 240 converts the digital phase shift control signal PS_d<(N−1):0> into a corresponding analog current signal, and inputs the analog current signal to a gain control end of the amplifier 340, to control a gain of the amplifier 340.

An input end of each amplifier receives one input signal, and output ends of all amplifiers are connected to an input end of the vector summation circuit, that is, an input end of the amplifier 310 receives an orthogonal input signal Q+, Q+ is amplified by the amplifier 310 to obtain an amplified signal OUT_Q+, and the amplified signal OUT_Q+ is output to the vector summation circuit 400 by using an output end of the amplifier 310; an input end of the amplifier 320 receives an orthogonal input signal I+, I+ is amplified by the amplifier 320 to obtain an amplified signal OUT_I+, and the amplified signal OUT_I+ is output to the vector summation circuit 400 by using an output end of the amplifier 320; an input end of the amplifier 330 receives an orthogonal input signal Q−, Q− is amplified by the amplifier 330 to obtain an amplified signal OUT_Q−, and the amplified signal OUT_Q− is output to the vector summation circuit 400 by using an output end of the amplifier 330; and an input end of the amplifier 340 receives an orthogonal input signal I−, I− is amplified by the amplifier 340 to obtain an amplified signal OUT_I−, and the amplified signal OUT_I− is output to the vector summation circuit 400 by using an output end of the amplifier 340.

The four input signals are four orthogonal signals, that is, a phase difference between Q+ and I+ is 90 degrees, a phase difference between I+ and Q− is 90 degrees, a phase difference between Q− and I− is 90 degrees, and a phase difference between I− and Q+ is 90 degrees.

An output end of the vector summation circuit 400 is used as an output end of the digital phase shifter. The vector summation circuit 400 performs vector summation on the four amplified signals OUT_I+, OUT_Q+, OUT_I−, and OUT_Q− that are input, to obtain and output a phase-shifted signal, that is, an output signal out of the digital phase shifter.

In this embodiment of this application, the four input signals may be specifically modulated signals obtained by modulating baseband signals by using a local-frequency signal. Correspondingly, the phase-shifted signal out that is output by the digital phase shifter is a RF signal.

In this embodiment of this application, according to a design requirement on the digital phase shifter, (N+2) is determined as a precision value of the digital phase shifter. The precision value is $360°/2^{(N+2)}$ when represented by an angle. Then, it is determined according to the precision value that a binary digital control source signal has N+2 bits in total. High-order 2 bits are respectively the $(N+1)^{th}$ bit and the $N^{th}$ bit, and may be denoted as PS<(N+1):N>, and low-order N bits are respectively the $(N-1)^{th}$ bit, the $(N-2)^{th}$ bit, ..., and the $0^{th}$ bit, and may be denoted as PS<(N−1):0>.

The logic control circuit 100 can control, according to four different values, that is, "00", "01", "10", and "11" of the high-order 2 bits PS<(N+1):N> in the (N+2)-bit digital control source signal received by the input end of the logic control circuit 100, the four output ends of the logic control circuit 100 to operate in four different output states. That is, the four values of the high-order 2 bits are in a one-to-one correspondence with the four output states, and each output state corresponds to one phase shift range of the digital phase shifter, so that the digital phase shifter can perform phase shift within four different phase shift ranges.

According to control logic of the logic control circuit 100 provided in this embodiment of this application, in each output state, there are two digital phase shift control signals being 0, analog current signals that are output by I-DAC corresponding to the two digital phase shift control signals are also 0, and amplified signals that are output by corresponding amplifiers are also 0. Therefore, in any output state, there are always two of the four amplified signals OUT_I+, OUT_Q+, OUT_I−, and OUT_Q− being 0, and the vector summation circuit 400 actually performs vector summation on the other two amplified signals that are not 0. Further, the four orthogonal input signals used in this embodiment of this application are equivalent to two pairs of phase-inverted signals, that is, Q+ and Q− are phase-inverted signals to each other, and I+ and I− are phase-inverted signals to each other, and the obtained corresponding four amplified signals are also two pairs of phase-inverted signals. Therefore, an output signal out having four different phase ranges can be obtained by means of vector summation on four different combinations of amplified signals. Details are as follows.

Assuming that the two digital phase shift control signals PS_c<(N−1):0> and PS_d<(N−1):0> are 0 in a first output state, when the amplified signals OUT_Q− and OUT_I− are 0, a summation result obtained by the vector summation circuit 400 by performing summation on OUT_I+ and OUT_Q+ is in a first quadrant, that is, an output signal out in this case may undergo phase shift within a 0° to 90° range.

Assuming that the two digital phase shift control signals PS_b<(N−1):0> and PS_c<(N−1):0> are 0 in a second output state, when the amplified signals OUT_I+ and OUT_Q− are 0, a summation result obtained by the vector summation circuit 400 by performing summation on OUT_Q+ and OUT_I− is in a second quadrant, that is, an output signal out in this case may undergo phase shift within a 90° to 180° range.

Assuming that the two digital phase shift control signals PS_a<(N−1):0> and PS_b<(N−1):0> are 0 in a third output state, when the amplified signals OUT_Q+ and OUT_I+ are 0, a summation result obtained by the vector summation circuit 400 by performing summation on OUT_Q− and OUT_I− is in a third quadrant, that is, an output signal out in this case may undergo phase shift within a 180° to 270° range.

Assuming that the two digital phase shift control signals PS_a<(N−1):0> and PS_d<(N−1):0> are 0 in a fourth output state, when the amplified signals OUT_Q+ and OUT_I− are 0, a summation result obtained by the vector summation circuit 400 by performing summation on OUT_Q− and OUT_I+ is in a fourth quadrant, that is, an output signal out in this case may undergo phase shift within a 270° to 360° range.

In an actual application scenario having a signal phase shift requirement, such as a phased array transceiver system or a MIMO system, a built-in conversion circuit of the system may be used to convert a signal IN whose phase is to be shifted into four orthogonal signals. The four orthogonal signals are used as input signals and input to the digital phase shifter. Then, an output signal out of the digital phase shifter is a signal obtained after IN is phase-shifted. A specific phase shift magnitude may be controlled according to the digital phase shift control signal that is output by the logic control circuit.

It can be learned that, the digital phase shifter provided in this embodiment of this application has the following beneficial effects.

(1) Phase shift within four ranges are 0° to 90°, 90° to 180°, 180° to 270°, and 270° to 360° and can be implemented by using the logic control circuit, and no additional phase shift switching circuit needs to be disposed.

(2) A circuit structure is simple, and an area occupied for manufacturing an integrated circuit is small, so that chip costs can be reduced, and an application requirement for a miniaturized mobile device is satisfied.

(3) The digital phase shifter is provided with the amplifiers, so that a signal that is output by the digital phase shifter has a larger gain as compared with an input signal, system efficiency can be improved, and it is helpful to drive a next power amplifier connected in series with the phase shifter.

(4) A phase shift precision is high, and the precision value of the digital phase shifter can be adjusted by changing a total bit quantity of the digital control source signal and a precision of the current digital-to-analog converter, so that different phase shifter design requirements are satisfied. In addition, because a high-precision phase shifter can reduce an antenna distance in a phased array system, the digital phase shifter provided in this embodiment can satisfy an application requirement for a miniaturized mobile device.

In a feasible embodiment of this application, in any one of the four output states of the logic control circuit 100, an N-bit digital phase shift control signal that is output by one of the four output ends of the logic control circuit 100 is C1, an N-bit digital phase shift control signal that is output by another output end is C2, and N-bit digital phase shift control signals that are output by the other two output ends are 0. In different output states, different output ends output the N-bit digital phase shift control signal that is C1. C1 is the same as the low-order N bits PS<(N−1):0> of the (N+2)-bit digital control source signal PS<(N+1):0>. C2 and C1 satisfy the following relationship: $C2=\sqrt{(2^N-1)^2-C1^2}$. The following describes, in detail with reference to the following Table 1 and FIGS. 3A-3D, a control principle of the logic control circuit 100 provided in this embodiment of this application.

logic control circuit 100 is PS<(N+1):0>, and a high-order 2-bit signal of the (N+2)-bit digital control source signal is PS<(N+1):N> and low-order N bits are PS<(N−1):0>, C1=PS<(N−1):0>([0, $2^N$−1] when expressed as a decimal value range), $C2=\sqrt{(2^N-1)^2-C1^2}$, and the four output states of the logic control circuit 100 are as follows.

(1) When the high-order 2-bit signal PS<(N+1):N> is "00", the N-bit digital phase shift control signal PS_a<(N−1):0> output by the first output end of the logic control circuit 100 is C1, PS_b<(N−1):0> output by the second output end is C2, and PS_c<(N−1):0> output by the third output end and PS_d<(N−1):0> output by the fourth output end are both 0. Corresponding to the foregoing first output state, the output signal out may undergo phase shift within the 0° to 90° range, as shown in a vector diagram in FIG. 3A.

(2) When the high-order 2-bit signal PS<(N+1):N> is "01", PS_d<(N−1):0> output by the fourth output end of the logic control circuit 100 is C1, PS_a<(N−1):0> output by the first output end is C2, and PS_b<(N−1):0> output by the second output end and PS_c<(N−1):0> output by the third output end are both 0. Corresponding to the foregoing second output state, the output signal out may undergo phase shift within the 90° to 180° range, as shown in a vector diagram in FIG. 3B.

(3) When the high-order 2-bit signal PS<(N+1):N> is "10", PS_c<(N−1):0> output by the third output end of the logic control circuit 100 is C1, PS_d<(N−1):0> output by the fourth output end is C2, and PS_a<(N−1):0> output by the first output end and PS_b<(N−1):0> output by the second output end are both 0. Corresponding to the foregoing third output state, the output signal out may undergo phase shift within the 180° to 270° range, as shown in a vector diagram in FIG. 3C.

(4) When the high-order 2-bit signal PS<(N+1):N> is "11", PS_b<(N−1):0> output by the second output end of the logic control circuit 100 is C1, PS_c<(N−1):0> output by the third output end is C2, and PS_a<(N−1):0> output by the first output end and PS_d<(N−1):0> output by the fourth output end are both 0. Corresponding to the foregoing fourth output state, the output signal out may undergo phase shift within the 270° to 360° range, as shown in a vector diagram in FIG. 3D.

According to the digital phase shifter provided in this embodiment of this application, the phase shift range is changed by changing the high-order 2-bit signal of the (N+2)-bit digital control source signal that is input to the logic control circuit, to change values C1 and C2 of the two non-0 digital phase shift control signals by changing the low-order N-bit signal of the digital control source signal, and change a phase of an output signal out that is finally obtained by means of vector synthesis, thereby implementing phase shift of a to-be-phase-shifted signal within a phase

TABLE 1

Table of control states of the logic control circuit

| State serial number | PS < (N + 1):N > | PS_a < (N − 1):0 > | PS_b < (N − 1):0> | PS_c < (N − 1):0> | PS_d < (N − 1):0> | Phase shift range |
|---|---|---|---|---|---|---|
| 1 | 00 | C1 | C2 | 0 | 0 | 0° to 90° |
| 2 | 01 | C2 | 0 | 0 | C1 | 90° to 180° |
| 3 | 10 | 0 | 0 | C1 | C2 | 180° to 270° |
| 4 | 11 | 0 | C1 | C2 | 0 | 270° to 360° |

Referring to the foregoing Table 1, assuming that the (N+2)-bit digital control source signal that is input to the shift range of the high-order 2-bit signal. It can be learned that, according to this application, phase shift control within a 360° phase shift range is implemented by using a digital signal, no additional phase shift switching circuit needs to be disposed, and the precision value of the digital phase shifter is adjusted by changing the total bit quantity of the digital control source signal and the precision of the current digital-to-analog converter, so that a good control precision is ensured, and different phase shifter design requirements are satisfied.

The current digital-to-analog converter in this embodiment of this application is configured to convert an N-bit digital phase shift control signal generated by the logic control circuit into a current signal, that is, an analog signal, at a corresponding magnitude.

In a feasible embodiment of this application, the current digital-to-analog converter may be a transistor array including N transistors connected in parallel. Sources of the N transistors in the transistor array are all grounded. Drains of the N transistors in the transistor array are connected, and used as an output end of the corresponding current digital-to-analog converter. A gate of each transistor in the transistor array is used as one input end of the corresponding current digital-to-analog converter, and each input end receives one bit of digital signal in the N-bit digital phase shift control signal.

Optionally, the transistor in the current digital-to-analog converter may be specifically a N-channel metal oxide semiconductor (NMOS) transistor, a P-channel metal oxide semiconductor (PMOS) transistor, or the like.

It should be noted that, an implementation of the current digital-to-analog converter in this embodiment of this application is not limited to the transistor array, and in another feasible embodiment, another current controllable circuit may be used.

Figure 4:
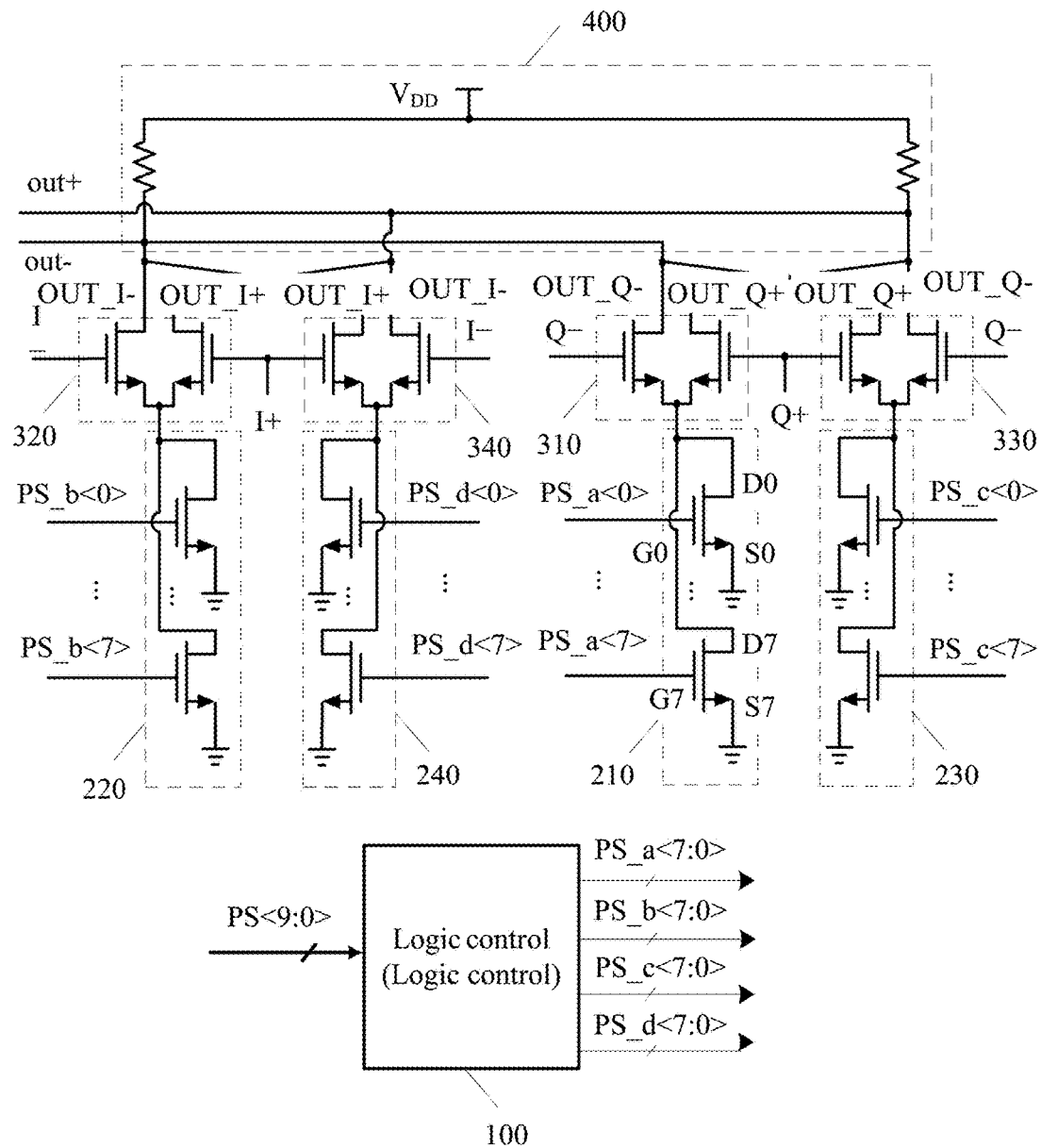
FIG. 4 is a diagram of a circuit structure of a digital phase shifter according to an embodiment of this application.

FIG. 4 is a diagram of a circuit structure of a digital phase shifter according to an embodiment of this application. The digital phase shifter shown in FIG. 4 has a 10-bit precision value, that is, N+2=10, a digital control source signal received by a logic control circuit 100 is a 10-bit digital signal PS<9:0>, and four output digital phase shift control signals all have 8 bits, that is, the 7$^{th}$ bit to the 0$^{th}$ bit. Each of I-DAC 210, 220, 230, and 240 is a transistor array including eight transistors (NMOS transistors) connected in parallel. The following focuses on description of a structure and an operating principle of the I-DAC provided in this embodiment of this application by using the I-DAC 210 as an example. The other three I-DAC 220, 230, and 240 may be understood with reference to the description.

As shown in FIG. 4, sources S7 to S0 of the eight transistors in the transistor array of the I-DAC 210 are all grounded. Drains D7 to D0 of the eight transistors are connected, used as an output end of the I-DAC 210 (an output current is a sum of eight drain currents), and connected to a gain control end of a corresponding amplifier 310. Gates G7 to G0 of the eight transistors sequentially receive eight digital signal bits in PS_a<7:0> output by a first output end of the logic control circuit 100. Assuming that PS_a<7:0> is "01001011", the gate G7 receives the 7$^{th}$ bit of digital signal PS_a<7>, that is, "0", the gate G6 receives the 6$^{th}$ bit of digital signal PS_a<6>, that is, "1", ..., the gate G1 receives the 1$^{st}$ bit of digital signal PS_a<1>, that is, "1", and the gate G0 receives the 0$^{th}$ bit of digital signal PS_a<0>, that is, "1".

A gate input signal of each transistor may be used to control the transistor to be turned on or off. Specifically, as shown in FIG. 4, with NMOS transistors used, when a gate input signal is "1", a corresponding transistor is turned on (a drain and a source are connected), and the drain outputs a current; when a gate input signal is "0", a corresponding transistor is turned off (a drain and a source are disconnected), and the drain outputs no current (that is, a drain current is 0). In addition, with PMOS transistors used, when a gate input signal is "0", a corresponding transistor is turned on, and a drain outputs a current; when a gate input signal is "1", a corresponding transistor is turned off, and a drain outputs no current.

In a feasible embodiment of this application, in the current digital-to-analog conversion circuit including the transistor array, a magnitude of a current that is output by a drain of any transistor when the transistor is turned on is in direct proportion to a weight of a bit of a digital phase shift control signal that is input to a gate of the transistor.

Using N=8 shown in FIG. 4 as an example, bits corresponding to the input signals of the gates G0 to G7 in the digital phase shift control signal PS_a<7:0> increase in sequence, corresponding weights also increase in sequence, and when the corresponding transistors are turned on, drain output currents also increase in sequence.

Optionally, a reference current value $I_0$ may be preset, and when the any transistor in the I-DAC is turned on, the current that is output by the drain of the transistor is $I_i=2^i I_0$; i is the bit of the digital phase shift control signal that is input to the gate of the any transistor, and i=0, 1, 2, ..., or N−1.

Still using N=8 shown in FIG. 4 as an example, when a transistor corresponding to a gate G0 (i=0) is turned on, an output current of a corresponding drain D0 is minimum, and is set as the reference current value $I_0$. Then, when a transistor corresponding to a gate G1 (i=1) is turned on, an output current of a corresponding drain D1 is $I_1=2^1 I_0=2I_0$; when a transistor corresponding to a gate G2 (i=2) is turned on, an output current of a corresponding drain D2 is $I_2=2^2 I_0=4I_0$; ...; when a transistor corresponding to a gate G6 (i=6) is turned on, an output current of a corresponding drain D6 is $I_6=2^6 I_0=64I_0$; when a transistor corresponding to a gate G7 (i=7) is turned on, an output current of a corresponding drain D7 is $I_7=2^7 I_0=128I_0$.

In this embodiment, a physical size of a transistor may be designed to obtain an output current at a required magnitude.

It can be learned that, a quantity of transistors in an on state in a transistor array of a corresponding I-DAC can be controlled by using a quantity of "1" or "0" in an N-bit digital phase shift control signal, to control a value of a current sum obtained after drains are connected in parallel, and control a magnitude of a current that is to be input to a gain control end of a corresponding amplifier, that is, control amplification times of the amplifier. When more transistors are turned on, a drain current sum is larger, the current that is to be input to the gain control end of the corresponding amplifier is larger, and the amplification times of the amplifier are larger. Therefore, in this embodiment of this application, amplification times of amplifiers can be changed by changing a low-order N-bit signal of a digital control source signal, to change a magnitude of an output signal out of the phase shifter.

The amplifier in this embodiment of this application is configured to, under the control of the current signal that is output by the I-DAC, perform selection on four orthogonal input signals that are externally input, and amplify selected two input signals. According to different phases of the selected two input signals, an output signal out obtained by means of vector summation may fall in any quadrant of the vector diagram, that is, 360° phase shift can be implemented. In addition, a magnitude and an amplitude value of the output signal out can be adjusted by amplifying the selected two input signals.

In a feasible embodiment of this application, the amplifier may be implemented by a differential transistor pair. Sources of the differential transistor pair are connected, and used as a gain control end of the amplifier, and receive the current signal that is output by the corresponding I-DAC. Gates of the differential transistor pair are used as input ends of the amplifier, and receive two phase-inverted input signals in the four orthogonal input signals, such as Q+ and Q−, or I+ and I− above. Drains of the differential transistor pair are used as output ends of the amplifier, and output a pair of differential signals, such as OUT_Q+ and OUT_Q−, or OUT_I+ and OUT_I− above. Optionally, the differential transistor pair may be an NMOS transistor pair, or may be a PMOS transistor pair.

In the diagram of the circuit structure shown in FIG. 4, the amplifiers may be implemented by using NMOS transistor pairs. The following describes a structure and an operating principle of the amplifier provided in this embodiment of this application with reference to FIG. 4 by using the amplifier 310 as an example. The other three amplifiers 320, 330, and 340 may be understood with reference to the description.

As shown in FIG. 4, sources of a differential transistor pair of the amplifier 310 are connected, and used as a gain control end of the amplifier 310, and receive a current signal that is output by the I-DAC 210. One gate of the differential transistor pair receives an input signal Q+, and the other gate receives a phase-inverted input signal Q−. Under the control of the current signal from the gates, the two input signals Q+ and Q− are amplified and then are output by using drains of the differential transistor pair, to obtain a pair of amplified signals that are phase-inverted signals to each other, that is, differential signals Q+ and Q−. Two drain output signals of each amplifier are input to a vector summation circuit 400 for vector summation, to obtain differential output signals out+ and out−.

It can be learned that, according to the phase shifter provided in this embodiment of this application, magnitudes of currents that are output by the current digital-to-analog converters can be changed by changing the low-order N-bit signal of the digital control source signal, to change operating states (amplified or set to 0) and amplification times of the amplifiers, and change a phase shift range and an amplitude value of an output signal out that is output by the phase shifter.

Figure 5:
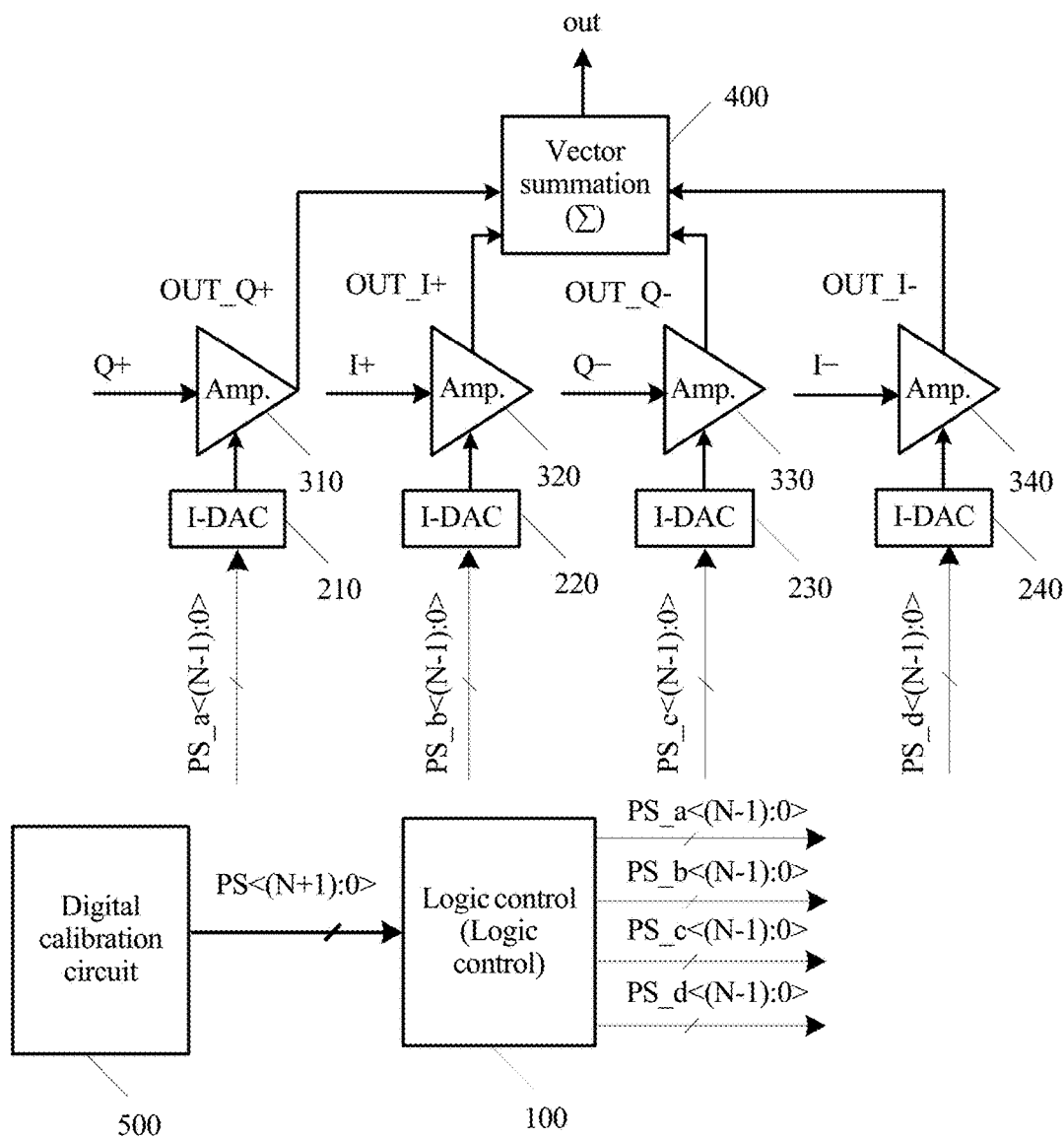
FIG. 5 is a diagram of a circuit module of another digital phase shifter according to an embodiment of this application.

Referring to a diagram of a circuit module shown in FIG. 5, the digital phase shifter provided in this embodiment of this application may further include a digital calibration circuit 500. An output end of the digital calibration circuit 500 is connected to the input end of the logic control circuit 100. The digital calibration circuit 500 is configured to generate the (N+2)-bit digital control source signal PS<(N+1):0> according to a DPD algorithm.

The digital calibration circuit in this embodiment of this application is reconfigurable (that is, logic or a resource of the digital calibration circuit may be updated to adjust a function of the digital calibration circuit), and may be specifically implemented by using software or reconfigurable hardware.

Optionally, the digital calibration circuit may be specifically implemented by using reconfigurable hardware such as a field-programmable gate array (FPGA, an on-chip digital circuit into which the digital phase shifter is to be integrated, or a digital signal processing (DSP) chip, to complete digital calibration for the digital phase shifter.

Compared with an existing phase shifter based on an active calibration circuit, the digital phase shifter provided in this embodiment of this application implements digital calibration by using a DPD method that is based on software or reconfigurable hardware, so that circuit complexity can be reduced, an effective phase precision of the phase shifter can be increased, and the phase error and the amplitude error of the phase shifter can be reduced.

In a feasible embodiment of this application, the digital calibration circuit may be specifically configured to determine, according to a preset control code table, a control code corresponding to a phase of a to-be-output phase-shifted signal, and use the determined control code as the (N+2)-bit digital control source signal.

Based on this embodiment of this application, after a design of a digital phase shifter is completed according to the circuit structure in any embodiment above, $2^{(N+2)}$ phase shift states of the digital phase shifter can be tested, and test data (including data such as a phase value and amplitude value of an output signal) can be collected. Training is performed by traversing test data corresponding to all the phase shift states, to determine a control code (an (N+2)-bit binary code) corresponding to an optimum phase value or amplitude value in each phase state, and the control code is saved in the digital calibration circuit in a form of a control code table, that is, the preset control code. In an actual operating process of the digital phase shifter, the digital calibration circuit can directly invoke a corresponding control code from the preset control code table according to a phase or an amplitude value of a signal that is currently to be output, use the control code as the (N+2)-bit digital control source signal, and input the (N+2)-bit digital control source signal to the logic control circuit for phase shift control.

Figure 6:
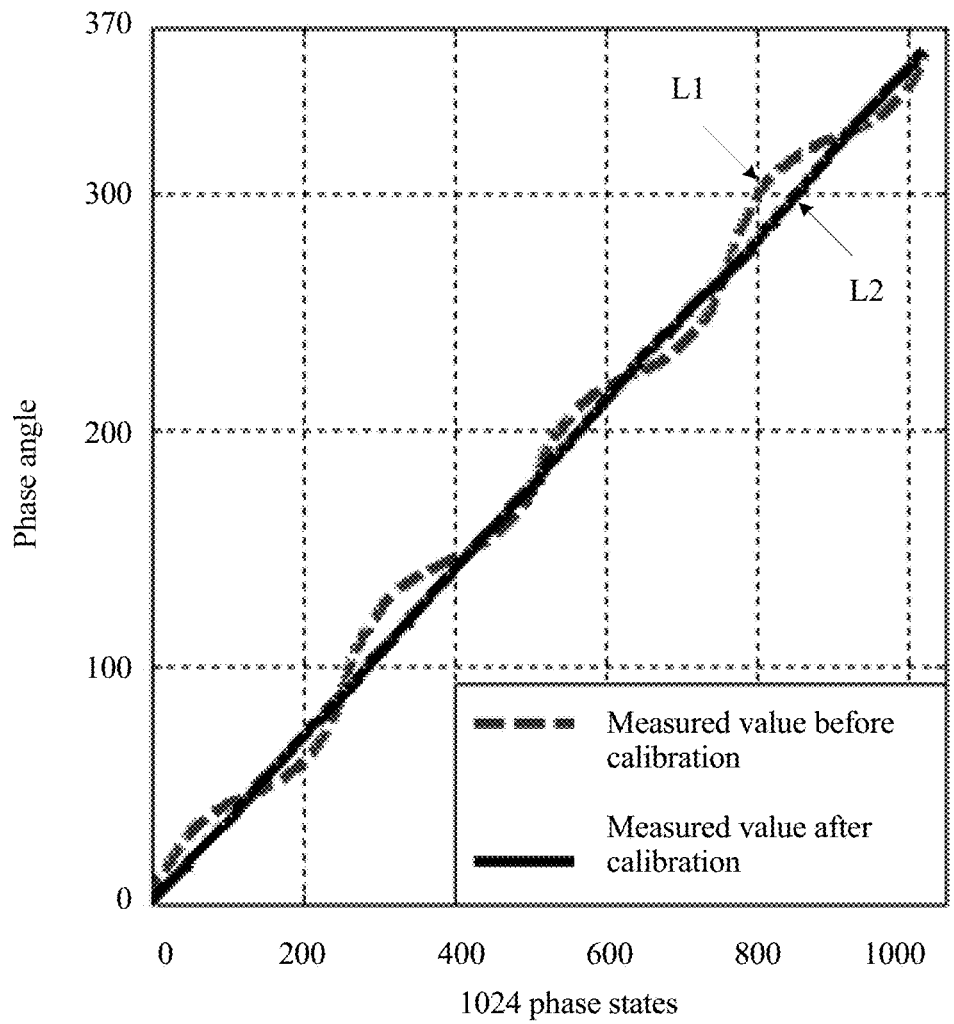
FIG. 6 is a diagram of a comparison between phases of a digital phase shifter before and after pre-distortion calibration according to an embodiment of this application.

FIG. 6 is a diagram of a comparison between 1024 (that is, $2^{10}$) phases of output signals of a 10-bit (a phase precision is 3.5°) digital phase shifter designed based on an embodiment of this application before and after DPD calibration. It can be learned from FIG. 6 that, a phase curve L1 before calibration presents a non-linear change, a phase error is relatively large, while a phase curve L2 after DPD calibration basically presents a linear change and is close to a theoretical value. It can be learned by actual calculation that, a phase/amplitude error after DPD calibration is less than 0.3°/0.2 dB. It can be learned that, according to the digital phase shifter provided in this embodiment of this application, a phase error can be significantly reduced by means of DPD calibration.

For same or similar parts in the embodiments in this specification, refer to these embodiments. Especially, an integrated circuit embodiment is basically similar to a method embodiment, and therefore is described briefly. For related parts, refer to descriptions in the method embodiment.

The foregoing descriptions are implementations of this application, but are not intended to limit the protection scope of this application.

What is claimed is:

1. A digital phase shifter, comprising:
   a logic control circuit; wherein the logic control circuit is configured to:
   receive an (N+2)-bit digital control source signal;
   generated four N-bit digital phase shift control signals according to the (N+2)-bit digital control source signal; and
   output the four N-bit digital phase shift control signals, wherein low-order N bits of the (N+2)-bit digital control source signal are used to control magnitudes of the four N-bit digital phase shift control signals, wherein high-order 2 bits of the (N+2)-bit digital control source signal are used to control a correspondence between the four N-bit digital phase shift control signals and four output ends of the logic control circuit, and wherein N is natural number;

at least four current digital-to-analog converters coupled to the logic control circuit, wherein the at least four current digital-to-analog converters are each configured to:
receive one of the four N-bit digital phase shift control signals;
convert the four N-bit digital phase shift control signals into four current signals by means of digital-to-analog conversion; and
output the four current signals;

at least four amplifiers coupled to the at least four current digital-to-analog converters, wherein the at least four amplifiers are configured to:
receive respective four orthogonal input signals;
perform gain control on the four orthogonal input signals using the four current signals to obtain four amplified signals; and
output the four amplified signals, wherein each amplifier corresponds to one input signal and one current signal; and a vector summation circuit coupled to the at least four amplifiers, wherein the vector summation circuit is configured to:
perform vector summation on the four amplified signals to obtain a phase-shifted signal; and
output the phase-shifted signal.

2. The digital phase shifter according to claim 1, wherein the logic control circuit controls, according to four different values of the high-order 2 bits in the (N+2)-bit digital control source signal, the four output ends to operate in four different output states, wherein in any output state, an N-bit digital phase shift control signal that is output by one of the four output ends is C1, wherein an N-bit digital phase shift control signal that is output by another output end is C2, wherein N-bit digital phase shift control signals that are output by other two output ends are 0, wherein in different output states, different output ends output the N-bit digital phase shift control signal, wherein C1 is the same as the low-order N bits of the (N+2)-bit digital control source signal, and wherein C2 and C1 satisfy $C2=\sqrt{(2^N-1)^2-C1^2}$.

3. The digital phase shifter according to claim 2, wherein the phase-shifted signal has four phase shift ranges, wherein the four phase shift ranges are in one-to-one correspondence with the four output states of the logic control circuit, and wherein the four phase shift ranges are 0 degree (°) to 90°, 90° to 180°, 180° to 270°, and 270° to 360°.

4. The digital phase shifter according to claim 1, wherein each current digital-to-analog converter comprises:

N transistors connected in parallel;
sources of the N transistors are grounded;
drains of the N transistors are connected, and used as an output end of each current digital-to-analog converter; and
gates of the N transistors are used as input ends of each current digital-to-analog converter, wherein each input end receives one bit of digital signal in the N-bit digital phase shift control signal, for controlling a connection and disconnection between a drain and a source of a corresponding transistor.

5. The digital phase shifter according to claim 4, wherein a magnitude of a current that is output by a drain of any transistor in each current digital-to-analog converter when the transistor is turned on is in direct proportion to a weight of a bit of a digital phase shift control signal that is input to a gate of the transistor.

6. The digital phase shifter according to claim 5, wherein the current that is output by the drain of any transistor in each current digital-to-analog converter when the transistor is turned on is $I_i=2^i I_0$, wherein i is the bit of the digital phase shift control signal that is input to the gate of any transistor, wherein i=0, 1, 2, ..., or N−1, and wherein $I_0$ is a preset reference current value.

7. The digital phase shifter according to claim 1, wherein each amplifier comprises a differential transistor pair, wherein sources of the differential transistor pair are connected; and used as a gain control end of each amplifier, wherein gates of the differential transistor pair are used as input ends of the each amplifier and receive two phase-inverted input signals in the four orthogonal input signals, and wherein drains of the differential transistor pair are used as output ends of each amplifier and output a pair of differential signals that are obtained after the two phase-inverted input signals are amplified.

8. The digital phase shifter according to claim 1, further comprising a digital calibration circuit, wherein an output end of the digital calibration circuit is connected to an input end of the logic control circuit, and wherein the digital calibration circuit is configured to generate the (N+2)-bit digital control source signal according to a digital pre-distortion algorithm.

9. The digital phase shifter according to claim 8, wherein the digital calibration circuit is reconfigurable; and comprises any of a processing chip storing calibration software, a field-programmable gate array, or an on-chip digital circuit into which the digital phase shifter is to be integrated.

10. The digital phase shifter according to claim 8, wherein the digital calibration circuit is configured to:
determine, according to a preset control code table, a control code corresponding to a phase of a to-be-output phase-shifted signal; and
use the control code as the (N+2)-bit digital control source signal.

* * * * *

UNITED STATES PATENT AND TRADEMARK OFFICE
CERTIFICATE OF CORRECTION

PATENT NO.        : 10,128,817 B2
APPLICATION NO.   : 15/816163
DATED             : November 13, 2018
INVENTOR(S)       : Huizhen Qian and Xun Luo Page 1 of 1

It is certified that error appears in the above-identified patent and that said Letters Patent is hereby corrected as shown below:

On the Title Page

1. Item (30), Line 1: "201611019105" should read "201611019105.7"

In the Claims

2. Column 14, Line 61: "generated" should read "generate"

Signed and Sealed this
Fifth Day of February, 2019

Andrei Iancu
*Director of the United States Patent and Trademark Office*